United States Patent [19]
Ahntholz

[11] 3,969,711
[45] July 13, 1976

[54] LINE ISOLATION MONITOR AND ALARM

[75] Inventor: Herbert Ahntholz, Berwyn, Ill.

[73] Assignee: Litton Systems, Inc., Bellwood, Ill.

[22] Filed: Apr. 25, 1975

[21] Appl. No.: 571,773

[52] U.S. Cl............................. 340/255; 317/18 R; 317/18 D; 340/253 R
[51] Int. Cl.²................................ G08B 21/00
[58] Field of Search............... 340/255, 253 R, 248; 317/17, 18 R, 18 D, 33 SC; 324/51

[56] References Cited
UNITED STATES PATENTS

| | | | |
|---|---|---|---|
| 3,579,219 | 5/1971 | Wolfframm | 340/255 |
| 3,666,993 | 5/1972 | Legatti | 340/255 X |
| 3,696,366 | 10/1972 | Parsons | 340/255 |
| 3,699,392 | 10/1972 | Lee et al. | 317/18 R |
| 3,754,221 | 8/1973 | Stelter | 340/255 |
| 3,757,169 | 9/1973 | Beresnikow | 317/18 R |
| 3,816,816 | 6/1974 | Schweitzer, Jr. | 340/253 A |
| 3,868,665 | 2/1975 | Treglown | 340/255 |

*Primary Examiner*—John W. Caldwell
*Assistant Examiner*—Daniel Myer
*Attorney, Agent, or Firm*—Ronald M. Goldman

[57] ABSTRACT

The monitor includes a pair of circuits; each circuit includes a resistor and an SCR in series and each circuit is connected to a respective end of a center-tapped primary of a current transformer. Means are provided to alternately and cyclically operate the SCR's from an OFF to an ON state. A current path is provided between the center tap of said primary and ground. Current through the pair of circuits and the current path is monitored to determine leakage to ground for controlling alarm means.

The novel alarm structure accomplishes the foregoing with a means that derives a DC voltage representative of the condition and combines that voltage in subtractive relationship with the voltage of a reference source and applies the sum to the gate of a Silicon Controlled Rectifier. A second and third voltage source provide AC voltage, oppositely poled, one of which is rectified by a rectifier, the second of which is rectified by the SCR, when in its current-conducting conditions, and means combine the rectified voltages in an essentially subtractive relationship. A first indicator operates when the combined voltage is of one polarity and a second indicator operates when the combined voltage is of a second polarity.

13 Claims, 9 Drawing Figures

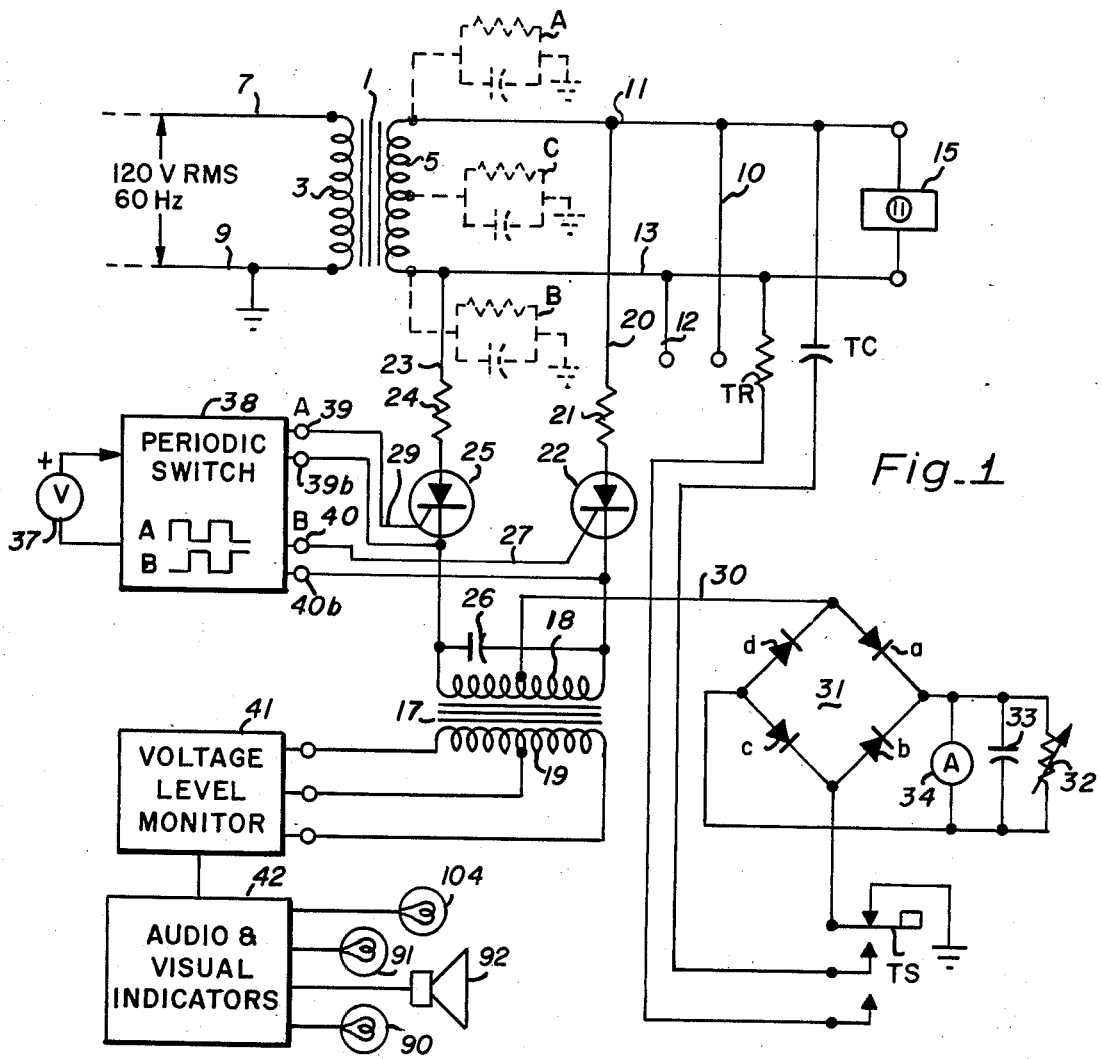
Fig. 1
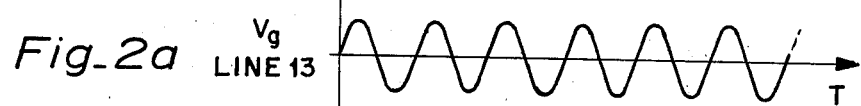
Fig. 2a  $V_g$ LINE 13
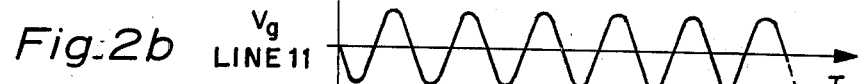
Fig. 2b  $V_g$ LINE 11
Fig. 2
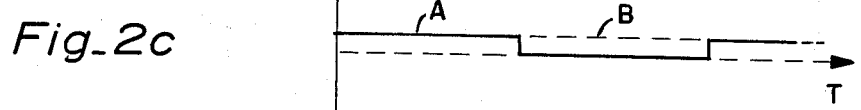
Fig. 2c
Fig. 2d  FLUX
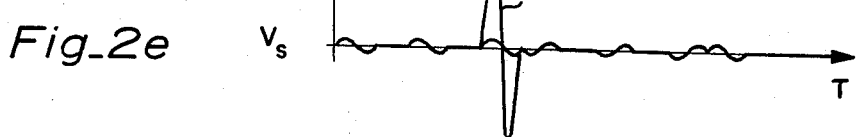
Fig. 2e  $V_s$

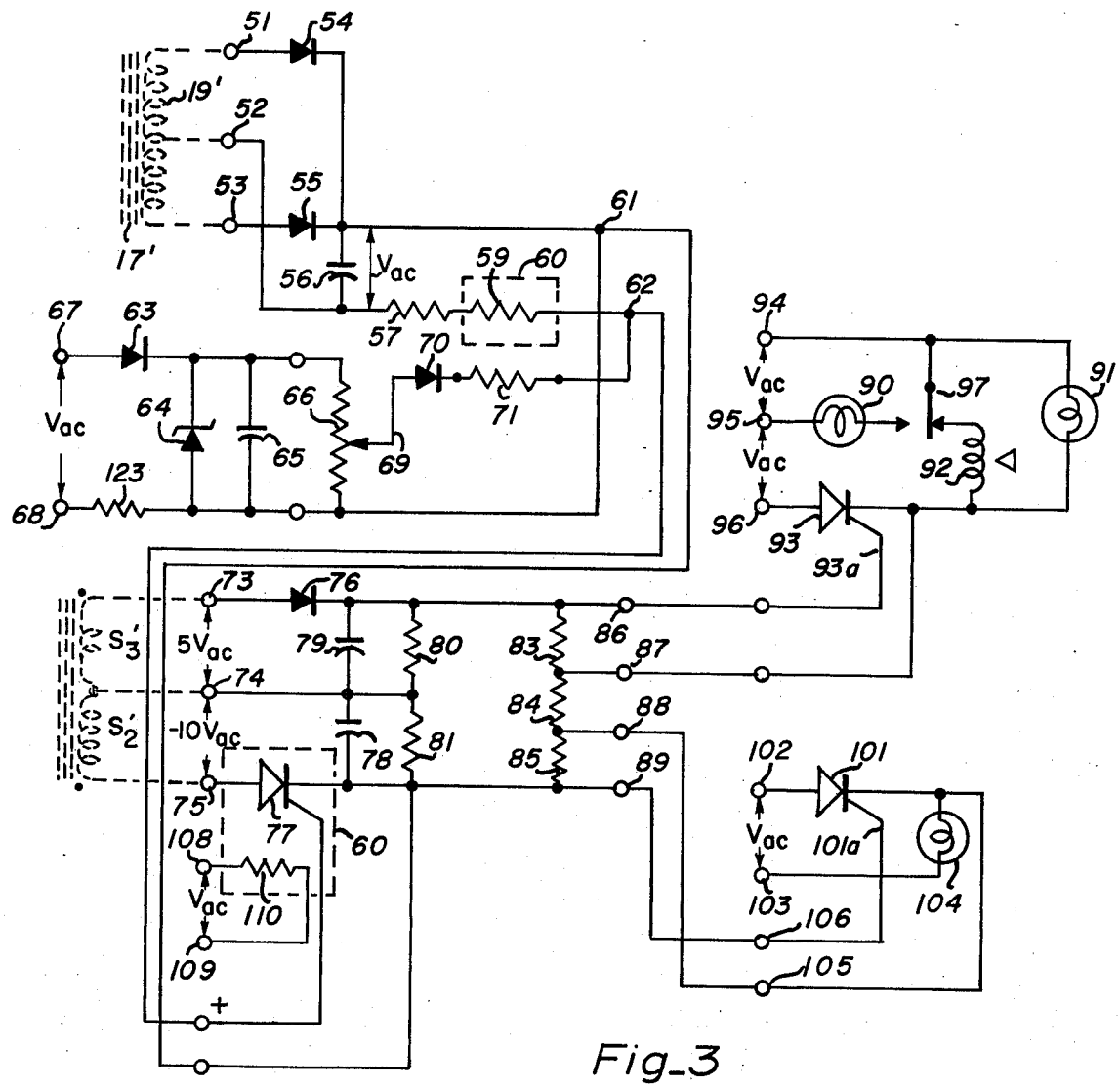
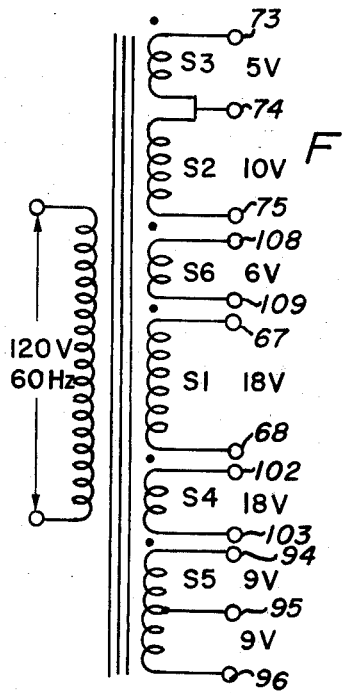
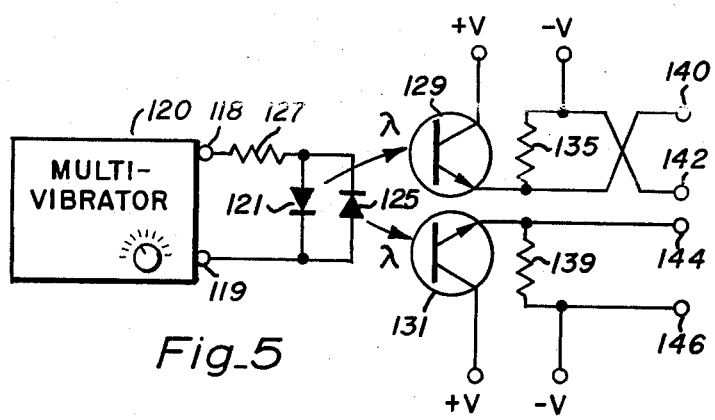
Fig_3
Fig_4
Fig_5

LINE ISOLATION MONITOR AND ALARM

BACKGROUND OF THE INVENTION

My invention relates to a line isolation monitor and, more particularly, to a circuit for monitoring the level of electrical leakage current between the lines of an isolated AC electrical system, which are isolated from electrical ground potential, and electrical ground potential. My invention also relates to a novel voltage level alarm system particularly useful in my novel line isolation monitor.

The electrical line isolation monitor provides the means of detecting an unduly high leakage of electrical current between the lines of an isolated electrical system and electrical ground potential or "ground" from which that electrical system is ideally isolated. As is known, electricity is supplied by the utility company and is distributed to on-premises locations by at least two electrical lines. Typically one of the two lines is connected to electrical ground potential and this thus creates a voltage difference between the other electrical line and any object or equipment connected to "ground". In some applications an isolated or "ungrounded" electrical system must be employed, such as in hospital operating rooms. In this application it is necessary to eliminate any difference of potential or leakage current path between the electrical supply system and ground. The reasons for this is at least twofold: One is to eliminate the danger of electrical shock to a patient undergoing connection directly or indirectly to various types of medical electronic equipment; the second is to avoid the generation of electrical sparks particularly in locations where combustible gases, used as anesthetics, are employed and which may explode in the presence of an electrical spark.

Conventially, hospital electrical systems employ what is known as an electrical isolation transformer, a transformer which contains a primary winding and a separate secondary winding of approximately the same number of turns in each winding in which there is no direct electrical connection beween the windings. The primary winding is connected to the electrical lines supplied by the electrical utility, one of which is grounded, and the secondary winding, which is isolated from direct electrical contact with the primary, is connected via a pair of electrical lines through the various electrical outlets in the hospital location. Thus a person could hold one end lead of the secondary winding in one hand and touch electrical ground potential with the other hand without receiving any electrical shock. Inasmuch as the primary, which is connected to ground, and secondary are isolated from one another, there is no voltage difference between the aforedescribed locations.

In practice, however, there is always some finite amount of leakage current, however small, for example, between the secondary winding, through the electrical insulation to ground; between the secondary and primary or between any part of the winding or electrical leads, through the electrical insulation to ground. In a practical system these leakage paths possess impedance levels on the order of "mogohms" of resistance or impedance and are essentially negligible. It is however possible, in the event that electronic equipment connected to the isolated system fails or causes an electrical short circuit, for a current path to develop between the secondary winding circuit and ground. Likewise if the electrical insulation in the transformer or in the electrical systme deteriorates over a period of time, a low resistance path to ground may be created. Obviously if one portion or side of the secondary lines are directly or indirectly connected through any resistance to ground then an electrical voltage exists between the remaining electrical conductor in that system and ground. If the impedance of the path to ground is sufficiently "low", current can flow. Thus should a patient be in contact to a grounded floor and be exposed to one of the other leads in the electrical supply system, the patient could sustain electrical shock.

Conservative practice dictates that the electrical condition of each side of the line be monitored. To actively monitor the degree of isolation of the electrical lines in an electrically isolated supply system, line isolation monitoring equipment is thus employed.

One apparatus for this purpose is described in U.S. Pat. No. 3,666,993 to Legatti, as has been made known to me, and I believe other similar apparatus exist. Present basic requirements for line isolation monitoring system are that the system be sensitive enough to detect a leakage on the order of 0.7 to 2.0 milliamperes of electric current, and, secondly, for the equipment itself to contribute a maximum leakage to ground of 20 microamperes, and, thirdly, for the maximum current under a test condition, in which each side of the line is short-circuit to ground, alternately, to be 1 milliampere.

SUMMARY OF THE INVENTION

In accordance with the foregoing purposes, I have devised a novel line isolation monitoring apparatus capable of detecting a leakage current greater than 2.0 l milliamperes, and which contributes to leakage current by less than 6.0 microamperes, and a maximum test current of less than 6.0 microamperes, and a maximum test current of less than one milliampere. My invention provides further a line isolation monitoring apparatus which is simple to build, install and adjust which is accurate and reliable.

In accordance with the foregoing objects, my invention includes a current transformer having a primary and secondary windings, a first series electrical circuit consisting of a resistor and a semiconductor controlled rectifier for connection between a first line of the isolated AC electrical system and the primary of said transformer, a second series electrical circuit consisting of a resistor and a semiconductor controlled rectifier for connection between the second line of the isolated AC electrical system and the remaining end of the primary winding. Electrical circuit means, including resistance means, is connected between a center tap on the transformer primary winding and electrical ground potential. And periodic switch means are provided for controlling said semiconductor control rectifiers to periodically and alternately trigger such switch means from the nonconducting to the current conducting state. In accordance with another apsect of my invention, said electrical circuit means includes a bridge rectifier means having its input connected between said center tap winding and electrical ground potential and having its output connected to a parallel connection of a resistor and a microammeter. In accordance with a further aspect of the invention the secondary of the tranformer is connected to the input of a voltage level monitoring and indicating means. The voltage level monitoring and indicating means provides a first visual indication in response to said secondary voltage exceeding a predetermined level and a second indication when said secondary voltage is below that level. In accordance with a still further aspect of the invention a capacitor is connected across the primary winding of the transformer forming a resonant circuit at the frequency of the AC line. The voltage level alarm combines a derived voltage representative of the voltage monitored with that of a reference source and applies the difference voltage to the gate input of an SCR. The SCR is coupled as a rectifier to a source of AC and another source of AC, 180° out of phase with the first AC source, is coupled to a second rectifier and the output of both recitifiers is combined across a voltage divider network, whereby when the SCR is nonconducting the output voltage across the divider network is of a first polarity and when the SCR is in a current-conducting condition the combined voltage is of the opposite polarity.

The foregoing objects and advantages of my invention as well as the structure characteristic of my invention are better understood by giving consideration to the detailed description of a preferred embodiment of the invention which follows, considered together with the figures of the drawings.

BRIEF DESCRIPTION OF DRAWINGS

In the drawings:

FIG. 1 illustrates a preferred embodiment of my invention;

FIGS. 2a through 2e are graphic representations of voltages and signals ideally obtained in the operation of the embodiment of FIG. 1;

FIG. 3 illustrates a preferred embodiment of a voltage level monitoring and indicating means employed in the embodiment of FIG. 1;

FIG. 4 illustrates schematically a transformer which may be used to supply appropriate power supply voltages to the monitor of FIGS. 3; and FIG. 5 illustrates a preferred embodiment of a periodic switching means employed in the preferred embodiment of FIG. 1.

DESCRIPTION OF THE PREFERRED EMBODIMENTS

FIG. 1 illustrates schematically and symbolically a preferred embodiment of the invention as well as an isolated electrical supply system to which the preferred embodiment is connected. The electrical supply system includes a conventional isolation type transformer 1 containing a primary winding 3 and a secondary winding 5, which windings suitably may contain the same number of turns of insulated electrical wire.

Primary 3 is connected to electrical leads 7 and 9 of the electrical distribution system, which provides the AC voltage, typically 120 volts RMS 60 hertz. As represented by the ground symbol in the FIG., line 9 is connected to electrical ground potential. Secondary 5 is connected to electrical leads 11 and 13 which in turn are connected to the various electrical outlets, represented by 15 symbolically in this FIG. which are thus isolated from the ground in the primary circuit.

The isolation monitor includes a current transformer 17. The transformer includes a primary 18 and a secondary 19 and, as illustrated in the figure, each of the primary and secondary have a center tap, a lead electrically connected to the middle of the winding. The current transformer is typically of the type which contains a low impedance primary winding and a multi-turn high impedance secondary winding so as to permit transformation of various AC or pulse DC currents through the primary to a usable level of voltage in its secondary winding.

A first series electrical circuit is provided between line 11 via electrical lead 20, a resistor 21, and the anode to cathode circuit of a semiconductor or silicon controlled rectifier 22, and one end of primary winding 18. A second series electrical circuit is provided between line 13 via an electrical lead 23, a resistor 24, and the anode to cathode circuit of a second semiconductor or silicon controlled rectifier 25, and from the cathode of the SCR 25 to the other end of primary winding 18. Each of the semiconductor controlled rectifiers is of a conventional structure. SCR 22 has a control or trigger input 27 and SCR 25 has a control or trigger input 29.

A capacitor 26 is connected across primary 18. Capacitor 26 is sized so as to combine with the primary's inductance and form a tuned circuit which is anti-resonant at the AC line frequency, suitably 60 hertz.

The center tap of primary winding 18 is electrically connected by electrical lead 30 to one input of a bridge rectifier 31. The other input of the bridge rectifier 31 is connected to electrical ground potential, as represented by the symbol, via the transfer and break contacts of a test switch TS. The bridge rectifier is of a conventional structure and comprises four rectifier diodes connected substantially as shown.

A resistor 32, which is adjustable, a capacitor 33, and a microammeter 34 are connected electrically in parallel across the output terminals of bridge rectifier 31. Effectively, in this circuit the elements located between electrical lead 30 and ground potential form essentially a resistance means as becomes apparent from the following description, which effectively places resistance 32, by way of example, in the series circuit between lead 30 and electrical ground potential.

The embodiment includes a periodic electronic switch 38 by having two outputs 39 and 40, symbolically represented by the rectangle in the figure. Suitably a source of operating voltage 37 for the electronic switch is provided. The first output 39 is connected electrically to trigger input 29 of SCR 25 and the second output 40 is connected to the trigger input 27 of the SCR 22. A second lead 39b is connected between a portion of the switch circuit and the cathode of SCR 25 and a corresponding second lead 40b is connected to the cathode circuit of SCR 22 in order to place a neutral in the SCR circuits. The periodic switch 38 is of any conventional structure which provides a voltage output first at one output and then at the second output and continues to alternate an output voltage between the two ouputs in that prescribed manner.

The secondary winding 19 is connected via electrical leads to the input of a voltage level monitor and indicator designated by the rectangle 41 in the FIG. The voltage level monitor includes a voltage sensing or detecting circuit that may be of conventional structure in combination with an indicating alarm means that may be of conventional structure as represented by the rectange 42, lamp 104, lamp 90, lamp 91 and audible device 92.

For convenience in understanding the operation of the invention I have represented in dash lines and labeled three separate electrical impedances considered as a parallel combination of a resistance and a capacitance connected between each of three locations in the isolated secondary circuit and electrical ground potential: to one end of the secondary winding 5, as at A, to the other end of the secondary winding 5, as at B, and to the middle of secondary winding 5, as at C. In operation the electrical utility supplies the AC line voltage, typically 120 volts RMS, at a frequency of 60 hertz, across lines 7 and 9 which are applied to primary 3. Through transformer action in transformer 1 the voltage is transferred into the secondary winding 5 and accordingly appears as the same voltage and frequency across electrical leads 11 and 13. The voltage is applied over these lines to the numerous electrical outlets, represented by outlet 15 of conventional structure, through which electrical loads such as medical electronic equipment may be connected to receive AC power.

With a suitable source of power applied the periodic switch 38, which operates, for example, at a frequency of 18 hertz, provides a voltage output at lead 39 for a predetermined period of time and then reduces that to a lower level while correspondingly raising the voltage at output 40 to the requisite level necessary to trigger the associated SCR into its current conducting conditions. Thus considering first the output at 39 applied to trigger input 29 of SCR 25, SCR 25 is thereby placed in the current conducting condition to complete a path for electrical current from electrical ground potential through the leakage impedance A through the secondary winding 5 over lead 13 and lead 23, resistor 24, through the SCR to te input of primary 18 and from there out lead 30 to the bridge rectifier circuit where the electrical current flows through diode "a" through resistor 32, through diode "c" and thence to electrical ground potential. SCR 25, once triggered "on", remains in the current conducting state until the polarity of the voltage appearing at its anode circiut reverses as would normally occur with AC on the electrical supply system.

The level of current through the aforedescribed path is dependent in great part upon the impendance level of impedance A. Thus where the impendance A is high, as should normally be the case, the current is of neglibible level, whereas if due to some malfunction in the electrical supply system impedance A is low, then a larger current flows through the defined path.

Due to the fact that the periodic switch is operated at a lower rate than the electrical supply frequency, i.e. 18 hertz versus 60 hertz, SCR 25 remains in the current cnducting condition through a number of AC cycles.

A similar current-conducting path is formed from electrical ground potential through impedance B, the secondary winding 5 over electrical lead 11 and electrical lead 20, resistor 21, SCR 22 anode, SCR 22 cathode, to the other end of primary 18, thence through the center tap over electrical lead 30 to the bridge rectifier circuit and through the various impedances to ground potential, as represented by the symbol connected to one of the output arms of the bridge rectifier 31. SCR 22, once triggered, remains "on" until the polarity of the voltage applied to its anode reverses. However, as in the preceding case, the output at lead 40 remains over a period of several AC cycles of the AC voltage secondary 5.

Meter 34 is typically a very sensitive voltmeter that is calibrated in microamperes. Thus the level of voltage across resistor 32 is representative of the current through the individual circuits and thus is representative of the leakage current through each of or any combination of impedances A, B and C. Capacitor 33 tends to smooth or stabilize the DC voltage across resistor 32. Thus a visual indication of the leakage current level is immediately available.

Each of the SCR's 22 and 25 are unidirectional current-conducting devices, thus for a period of time in which SCR 25 is in the current-conducting or "on" condition a series of unidirectional current pulses are applied through one-half of the primary 18 and likewise during the period in which SCR 22, is in the current-conducting or "on" condition, a series of unidirectional current pulses are applied through the other half of primary winding 18 in the aforedescribed manner. Inasmuch as transformer 17 is a current transformer, the very small current levels in the primary through transformer action induces a voltage in secondary 19. This voltage is applied via the electrical leads shown to the input of the voltage level monitor 41. The voltage level monitor may be of any conventional structure satisfying the requirements of the system and include various audio and visual indicators represented by rectangle 42, indicator lamp 104, lamp 91, lamp 90, and audio alarm device 92.

In the normal condition the voltage output of transformer 19 is below a predetermined alarm level. Accordingly the voltage level monitor so senses and a normal condition is indicated by operation of lamp 104. On the other hand, assuming the level of voltage increases beyond the alarm level as previously determined, the lamp 91 and audio alarm 92, such as a beeper, operates to warn of the hazard condition while lamp 104 is de-energized. Through suitable switching means not illustrated in this figure, the beeper 92 may be disconnected leaving lamp 91 illuminated in the alarm condition while lamp 90 is energized, so as to allow the correction or necessary action to be undertaken without annoyance.

To further assist the reader to understand the operation of the invention, various representative wave forms depicting the variation of certain voltages with time, such as might be seen through use of an oscilloscope, are presented in FIGS. 1a through 2e. In FIG. 2a I represent the sinusoidal AC line voltage as appears on line 13 of FIG. 1 measured relative to ground which alternates at a 60 hertz rate and in FIG. 2b the corresponding voltage on line 11. In FIG. 2c I represent the voltage input to the trigger terminals of semiconductor controlled rectifiers 25 and 22 as a function of time as A and B, respectively. Inasmuch as the input to SCR's 22 and 25 are changed at a 20 hertz rate it is apparent from Curve A of FIG. 2c that SCR 25 remains on for at least three cycles of the AC line voltage on line 13 and then shuts off while the other SCR, as represented by Curve B in dotted line, is switched on for the same number of line half-cycles while the other SCR is in the noncurrent-conducting condition.

Inasmuch as each SCR is a unidirectional current-conducting device, any current through the circuit will occur only on a half-cycle of line voltage in which the polarity of the voltage applied to the anode of the SCR is positive. This is represented by the shaded portions of FIGS. 2a and 2b. As is known, the silicon controlled rectifier, once triggered to its "on" condition, remains in that state until the voltage at its anode goes from positive to zero. Thus even though there is no synchronism between the periodic switch which triggers the SCR "on", it is apparent that in the event that the trigger voltage switches off during a positive half-cycle in which the SCR is conducting, the SCR will continue to conduct until the positive half-cycle is completed. Likewise, even though the other SCR has the proper trigger potential applied thereto prior to the termination of conduction of the first SCR, the second SCR does not commence to conduct current until the line voltage phase goes into the positive half cycle. For purposes of illustration, FIG. 2d represents the magnetic field in the primary of transformer 17 of FIG. 1, and FIG. 2e the voltages as may be induced in the secondary winding 19. Thus in the normal condition, negligible current flows through either half of the primary winding and this magnetic field is represented by the series of discrete blips which flow during the positive half cycle of line voltage as at A. Assuming that a fault condition occurs, the level of current through the primary increases and hence the magnetic field as at B in FIG. 2d and a high voltage is generated in the secondary as at A in FIG. 2e. As is apparent, the current fed into the primary winding halves is a pulsating DC current. However inasmuch as the direction of the DC in the winding reverses each time the alternate SCR switches on, the magnetic core is reset.

Test switch TS is a manually operated switch having the transfer contact normally in contact with "break" contact and includes two separate normally isolated "make" type contacts. Capacitor TC and resistor TR are of selected fault values of microfarads and ohms, respectively. Capacitor TC as illustrated is connected in circuit between line 11 and one of the switch make contacts, and resistor TR as illustrated is connected in circuit between line 13 and the other switch make contact.

In operation, depressing the test switch operates the transfer contact to open its connection to the break contact, thereby removing electrical ground from one end of bridge 31, and sequentially engages the make contacts to place each of resistor TR and capacitor TC in effective circuit with the center tap of winding 18 to make a dual fault condition and simultaneously to place the resistor and capacitor in series circuit across lines 11 and 13. The valves are such that the voltage in the secondary of transformer 17 is raised to trigger an alarm condition.

I have also invented a novel voltage condition monitoring and alarm system and present an embodiment thereof in electrical schematic form in FIG. 3 useful for those purposes in conjunction with the embodiment of FIG. 1. For clarity to the extent possible, I have illustrated various portions of the circuit separately and connected them through schematically illustrated electrical leads that extend from separately identified circuit locations or junctions, which locations or junctions in a practical embodiment would merely be a position on an electrical conductor. The conductor responsive alarm useful includes the three inputs 51, 52 and 53, first and second rectifier diodes 54 and 55, a capacitor 56. As is shown, the cathodes of the diodes are electrically connected in common to one side of the capacitor 56 and are connected in circuit with terminal 61 reference point. Input 52 is connected to the other side of the capacitor 56 to form a conventional full wave rectifier circuit. A resistor 57 and a thermister, a resistor having a positive temperature coefficient of resistance, 59, is provided. The dashed line or rectangle 60 surrounding thermister 59 is a container which is discussed hereinafter. Resistors 57 and 59 are connected electrically in series between one side of capacitor 56 and terminal 52. The lead from resistor 59 connects to second terminal or reference point 62.

A rectifier diode 63, a Zener diode 64, a capacitor 65, and a resistor potentiometer 66 is connected as shown to form a rectifier and voltage divider circuit. The anode of diode 63 is connected to one input terminal 67 and the anode of the second diode 64 with a resistor 123 in series, is connected to the second input terminal 68. The cathode ends of diodes 63 and 64 are connected in common and smoothing capacitor 65 is connected across Zener diodes 64 in parallel with potentiometer 66. The anode of diode 64, one side of capacitor 63 and potentiometer 66 are connected in circuit to reference point 61. The tap 69 of the potentiometer is connected electrically in series with a diode 70 and a resistor 71 to the reference point 62. The reference points 61 and 62 are connected by the electrical leads illustrated to a second portion of the circuit hereinafter described as the indicator circuits.

The indicator circuit includes power supply source input terminals 73, 74 and 75. Rectifier diode 76 has its anode connected to source terminal 73 and its cathode connected to one end of capacitor 79 and resistor 80. A silicon controlled rectifier 77 has its anode connected to the input terminal 75 and has its cathode connected to one end of a capacitor 78 and resistor 81. The remaining ends of each of capacitor 79, resistor 80, capacitor 78, and resistor 81 are connected between to the reference voltage lead connected to power input terminal 74. As is apparent, the circuits form two rectifier circuits having an output voltage which is a combination of the separate voltages of each.

A resistance heater winding 110 is connected across AC power input terminals 108 and 109. Heater 110 is located together with SCR 77 and thermistor 59 in the small container represented by dash lines 60.

A resistor voltage divider bridge consisting of series connected resistors 83, 84 and 85 is provided connected between the cathodes of rectifiers 76 and 77 to provide the various voltage outputs at reference points or terminals 86, 87, 88 and 89.

The indicators include a first lamp 90, a second indicator lamp 91, an audible device 92, such as a conventional beeper, and a third lamp 104 and are allocated between two circuits as illustrated. Three electrical terminals 94, 95 and 96 are provided for connection to a suitable source of AC voltage as hereinafter described. A manually operated switch 97 of the single-pole double-throw variety includes a break contact, a transistor contact, and a make contact. The anode of a silicon controlled rectifier 93 is connected to AC input terminal 96 and the cathode terminal thereof is connected electrically to one end terminal of electrical beeper 92 and lamp 91. The other input terminal of the beeper is connected to the make contact of switch 97 and the transfer contact of switch 97 as well as the remaining terminal of lamp 91 are connected electrically to electrical terminal 94. The lamp 90 is connected at one end to terminal 95 as shown and to the make contact of switch 97.

The trigger input terminal 93a of SCR 93 is connected via the electrical lead illustrated to terminal 86 of the previously described circuit. The cathode of SCR 93 is connected by an electrical lead-in circuit to electrical terminal 87 of the aforedescribed circuit.

In the second indicator circuit a silicon controlled rectifier 101 has its anode connected to an AC power input terminal 102, and its cathode connected to one terminal of lamp 104. A second AC power input terminal 103 is connected in circuit with the other terminal of lamp 104. The trigger terminal 101a of SCR 101 is connected to an input terminal 106. As is illustrated, terminal 106 and 105 are connected by electrical leads, respectively, to output terminals 88 and 89 of the previously described circuit.

The transformer illustrated schematically in FIG. 4 is used to provide the various AC voltages for powering the indicator and supplying reference voltages and may be considered at this point. This transformer is schematically represented by the series of six secondary windings labeled S1, S2, S3, S4, S5 and S6, and a primary winding located on the magnetic iron core designated by three lines. For convenience the end terminals of the windings have been designated by the same numerals as the input terminals of the circuit described in FIG. 3 so that one can more easily recognize the connections. The primary winding may be connected to the isolated electrical supply system, such as via electrical leads 10 and 12 in FIG. 1, either directly by wired in leads or may be coupled thereto through one of the numerous electrical outlets 15. Transformer winding S2 is reverse wound from winding S3 and comprises approximately double the number of turns used in winding S3 so as to place windings S2 and S3 in a voltage subtractive relationship in which the voltages are 180° out of phase. This is shown by the polarity representing "dot" being on the right of winding 53 and on the left on winding S2. Thus when the voltage induced in secondary S2 is positive at terminal 74 with respect to its terminal 75 the voltage induced in winding S3 is negative at its terminal 73 with respect to its other winding end 74 and the AC voltage measured between terminals 73 and 75 is equal to the difference of the voltages induced in the various windings.

One of the critical components employed in this circuit is the combination of electrical heater 110, SCR 77 and thermistor 59, which are all located in the same enclosure represented by the dash lines 60. The voltage supplied from transformer winding S6 in FIG. 4 provides current through heater 110 to generate heat within enclosure 60. This raises the temperature of the ambient in which SCR 77 and thermisotr 59 is found to a desired temperature for, by way of example, 85° Fahrenheit. Due to the thermal lag however, a certain amount of time must pass before the ambient reaches this temperature. This will be considered hereafter in greater detail.

The AC voltage applied by winding S1 of FIG. 4 to input terminals 67 and 68 in FIG. 3 is rectified by diode 63 and smoothed by capacitor 65 and a DC voltage appears across potentiometer 66. Depending upon the setting of potentiometer tap 69 a certain DC voltage is applied through diode 70, resistor 71, and is applied across terminals 61 and 62. Correspondingly any AC voltages induced in the secondary of transformer 17 of FIG. 1, which is the voltage being sensed or monitored, is rectified by the full wave rectified circuit consisting of the diodes 54 and 55 and capacitor 56 and appears across capacitor 56 as a representative DC voltage. This voltage is applied via resistor 57 and thermistor 59 across terminals 61 and 62. Since the polarity of the voltage applied to terminal 61 by the bias circuit including resistor 71 is opposite to the polarity of the voltage output from thermistor 59, the resultant voltage across terminals 61 and 62 is either positive or negative depending on whether the sensed voltage across capacitor 56 is greater or lesser than that of the voltage from the reference voltage circuit. The potentiometer 69 is adjusted so that the resultant voltage for the alarm condition as observed on meter 34 in FIG. 1, at terminal 61, becomes positive in polarity and is just sufficient to exceed the voltage of the bias or reference source.

The reference voltage source provides via resistor 71 a predetermined voltage that is of a positive polarity relative to circuit location 68 and this positive voltage is applied to circuit location 62. Considering a normal condition, the output from the sensing circuit connected to the secondary of tranformer 17' is negligible and hence the voltage applied to terminal 62 in opposite polarity or in subtractive relationship with the voltage of the reference source thereby is small so as not to reduce substantially the voltage level of the positive polarity voltage at circuit location 62. This positive voltage is applied via the electrical lead to the control terminal of SCR 77 to cause the SCR to be in its normally conducting state.

Considering next the voltages applied across terminals 73, 74 and 75, it is apparent that the voltage of winding S3 is rectified and filtered by means of the diode 76, capacitor 79 and resistor 80, so that the voltage, suitably 5 volts, appears across resistor 80. With SCR 77 in its current conducting state, the SCR rectifies the AC voltage applied across 74 and 75 by winding S2 and charges up capacitor 78. Because windings S2 and S3 are wound in opposite phase, the charging currents in both halves of the circuit, to charge capacitors 79 and 78, occurs at the same time or during the same AC half cycle to avoid an erroneous output voltage.

As previously described, the AC voltages applied by transformer winding S2 of FIG. 3 between terminal 74 and 75 is 180° out of phase or subtractive with the AC voltage applied by transformer winding S3 between 73 and 74 and the AC voltage level applied across terminals 74 and 75 is larger than, suitably twice as great as, that applied across terminals 73 and 74. Thus as rectified the voltage of the cathode end of diode 76 to which capacitor 79 is charged is a positive V, such as +5, volts and the voltage at the cathode of SCR 77 to which capacitor 78 is charged to a positive polarity 2V, such as +10, volts. Taking the latter location as a reference point, the voltage at the other end of capacitor 78 is −2V and then adding the +V of capacitor 78 the sum of the voltages is −V. Consider the normal condition in which SCR 77 is maintained in the "on" or current conducting condition by a positive voltage, positive relative to the cathode thereof, applied to the trigger input thereof, the net DC voltage that appears between terminal 86 and 89 is the difference between the voltage from each section. Thus the voltage at terminal 86 is a negative V with respect to terminal 89. The voltage is divided by the voltage divider consisting of resistors 83, 84 and 85, to various lesser voltage levels and is applied to the various output circuits via circuit locations 86, 87, 88 and 89.

The voltage across resistor 83 is applied by leads to circuit locations 86 and 87 between the trigger input 93a of SCR 93 and the cathode of the SCR and the polarity at input 93a is of a negative polarity with respect to the cathode. Hence, SCR 93 remains in the "off" or noncurrent conducting condition.

The voltage appearing across resistor 85 is applied via circuit junctions 88 and 89 between the cathode of SCR 101 and trigger input 101a. Since the voltage applied to the cathode is negative in polarity with respect to that applied via output junction 89 to trigger input 101a or, as otherwise stated, the trigger input is at a positive voltage relative to the cathode, SCR 101 is maintained normally in an "on" or current conducting condition.

The SCR rectifies the AC voltage applied via winding S4 across terminals 102 and 103 to provide pulsating DC current to flow through lamp 104, the green lamp, and lamp 104 is maintained operative to indicate that the circuit is functioning and that line isolation conditions are proper.

The occurrence of an alarm condition is next considered. When the AC voltage sensed at input terminals 51, 52 and 53 and rectified and applied across terminals 61 and 62 exceeds that reference voltage from the circuit also applied across that circuit location and in subtractive relationship thereto, the voltage at junction 62 becomes negative with respect to that of junction 61. The polarity of the voltage at the control electrode of SCR 77 is thus changed to negative and the SCR thereby is switched to its "off" or noncurrent-conducting state. As a result, the AC applied between terminal 74 and 75 is no longer rectified and capacitor 78 discharges its voltage through resistor 81. Inasmuch as capacitor 79 continues to be charged to +V, the net voltage across resistors 80 and 81 taken at the cathode of diode 76 goes from a −V to a +V. Inasmuch as the cancelled voltage was of the opposite polarity and almost double the level of that appearing across the resistor 80, the new net voltage appearing between terminals 86 and 89 is of approximately the same level as before but is now of a positive polarity. The voltage now applied via junction 88 to trigger input 101a of SCR 101 now becomes negative in polarity with respect to that applied via junction 89 to the cathode thereof. SCR 101 then switches to its "off" or noncurrent-conducting state, cuts off current to lamp 104 and the lamp is extinguished.

On the other hand, the voltage applied via junction 86 to control input terminal 93a of SCR 93 now becomes positive in polarity with respect to that voltage applied via junction 87 to the SCR's cathode and SCR 93 is switched "on". SCR 93 conducts current from winding 55 of the transformer (FIG. 4) on one-half the AC cycle from terminal 96, the SCR, through lamp 91, to terminal 94 and, additionally, through the transfer and break contacts of switch 97 and the winding of beeper 92. Lamp 91, the red alarm lamp, is illuminated and beeper 92 is energized to provide both a visual and an audible alarm signal.

The attendant called to attend to the alarm may deenergize the beeper 92 by simply moving the transfer contact of switch 97 to its make position. This completes an AC current path between transformer winding 55, input terminal 94 through switch 97, the yellow lamp 90, and terminal 95 to energize lamp 90. Lamp 90 when illuminated concurrently with lamp 91, indicates that although an alarm condition is in existence, the alarm is being attended to.

Once the alarm condition has been corrected all of the circuits restore to normal with lamp 104 illuminated and lamp 91 extinguished. However the attendant must return switch 97 to its break position in order to extinguish the lamp 90.

One example of a periodic switching means for providing the control voltages for alternate switching of two silicon controlled rectifiers, which I prefer to use in the embodiment of FIG. 1, is illustrated schematically in greater detail in FIG. 5. This includes a conventional free-running multivibrator 120 symbolically illustrated by the rectangle. The multivibrator is a conventional and well-known solid state electronic switch that alternates the voltage level at its output between a high and low level at a rate determined by internal circuit parameters and is essentially free-running. The multivibrator may include means for adjusting the frequency of its periodicity such as represented by the adjustment dial in the figure to be within the preferred range which, by way of example, is preferably on the order of 18 to 20 hertz. A resistor 127 is connected at one end to the output terminal 118 and is connected at its other end to two parallel circuits. The first circuit includes a light-emitting diode, 121, connected to the other input 119, and the second circuit includes a light-emitting diode 125 electrically connected to output 119 to resistor 127 and diode 121. As is illustrated, the diodes which can conduct electrical current in one direction, from anode to cathode, are connected in circuit so that they are oppositely poled and hence conduct current in opposite directions. A first photosensitive transistor 129 and a second like transistor 131 are provided. Suitably the transistors are of an NPN type having a base that is light sensitive to control current between the transistor's collector and emitter. An optical input to transistor 129 is coupled to the optical output of diode 121. Similarly the optical input of transistor 131 is connected to the optical output of diode 125.

A resistor 135 is connected electrically to the emitter of transistor 129, and output junction labeled 140 and between "−V" and to junction labeled 142. A source of DC operating voltage is connected with its positive polarity terminal to the collector of transistor 129 as illustrated by the symbol "+V" and negative polarity to terminal symbol "−V".

A resistor 139 is connected electrically to the emitter of transistor 131 and output junction labeled 144, and between "−V" and to junction labeled 146. A source of DV operating voltage is connected with its positive polarity terminal to the collector as illustrated by the symbol "+V" and negative polarity to terminal symbol "−V".

In operation, the multivibrator is free-running at a set rate, for example, at 20 hertz or cycles per second. This provides an output voltage at reference point 118 which is positive with respect to terminal 119 for one-half cycle and on the alternate half cycle reverses the output voltage polarity. Thus for one-half cycle of operation of multivibrator 120, current flows through light emitting diode 121 and resistor 127 while diode 125 blocks current in the other circuit. Light emitting diode 121 converts the current therethrough into light, such as the characteristic red light available with commonly available LED's. This light is coupled into the photosensitive base of transistor 129. Initially, transistor 129 is considered in the noncurrent-conducting condition. The voltage at terminal 140 is negative with respect to 142, i.e. from source "−V" through resistor 135 to output terminal 140 and the output at terminal 142 is negative as well from source −V. With light from diode 121 incident upon the base of transistor 129, the transistor is switched into its current-conducting state. This provides a path for current from source "+V"

through the collector and emitter circuits, resistor 135 to the other source terminal −V. Because the transistor is "on" the voltage at the emitter is thus essentially at the same level of "+V" as the collector, and in turn this voltage appears at output terminal 140, thus making the output terminal 140 "positive" in polarity to the other output terminal 142.

Similarly on the alternate half-cycle of operation of multivibrator 120, diode 121 blocks current. And diode 125 conducts current to generate the light and thereby switch transistor 131 into its current-conducting condition, while transistor 129 is switched off. Thus the output at 144 becomes positive relative to output terminal 146 for the duration of the half-cycle of operation of multivibrator 120 during which diode 125 is conducting current. This operation continues at the rate or period of multivibrator 120 which is 20 times per second in the given example.

It is believed that the foregoing description of a preferred embodiment of my invention is sufficient to enable one skilled in the art to make and use the invention. However it is expressly understood that my invention is not confined to those details inasmuch as various modifications and substitutions as well as additions or improvements thereto become apparent to those skilled in the art upon reading this specification. As is evident from the generality of the foregoing description, by way of example, various types of periodic switching means other than that specifically illustrated may be substituted in the preferred embodiment and various other types of voltage level monitoring or condition responsive monitoring alarm circuitry may be employed.

Accordingly it is expressly understood that my invention is to be broadly construed within the full spirit and scope of the appended claims.

What I claim is:

1. A line isolation monitor for monitoring the leakage condition of an isolated electrical system having leads carrying AC voltages of a frequency of F hertz comprising:
   a core of magnetic material;
   a first winding on said core;
   a first end and a second end and a center tap on said winding;
   first circuit means connected to one end of said winding and adapted for connection to one of said power lines, comprising resistance means and series connected semiconductor controlled rectifier means;
   second circuit means connected between the other end of said winding and adapted for connection to a second of said power lines, said second circuit means including resistance means and series connected semiconductor controlled rectifier means;
   periodic switch means coupled to each of said semiconductor controlled rectifier means for alternately and cyclically triggering said semiconductor controlled rectifier means into the current conducting condition;
   said switch means having a periodic rate of less than said line frequency;
   means connected between said center tap and electrical ground potential for providing a resistive path therebetween to ground and measuring means associated with said last named means for indicating the current level through said path.

2. The invention as defined in claim 1 further comprising capacitor means connected between the ends of said winding, said capacitor means being sized to form with said winding a circuit resonant at said line frequency, whereby each controlled switch means is placed in the current conducting condition for a predetermined number of AC half cycles to complete a unidirectional current conducting path.

3. The invention as defined in claim 1 further comprising:
   a second winding located on said iron core, said second winding being inductively coupled to said first winding whereby current through said first winding generates a corresponding voltage in said second winding;
   means connected to said second winding for monitoring the level of voltage present in said second winding; and
   alarm means coupled to said voltage monitoring means for providing an alarm signal responsive to said voltage monitoring means for detecting a voltage greater than said predetermined level.

4. The invention as defined in claim 1 wherein said current carrying path comprises a bridge rectifier having a pair of input terminals, one of which is connected to said center tap and the second of which is connected to ground, and a pair of output terminals; resistor means connected across said output terminals and voltage monitoring meter means connected across and resistor means.

5. The invention as defined in claim 1 wherein said periodic switch means comprises:
   multivibrator means having an output;
   first and second light emitting diode means oppositely poled and connected across said multivibrator output;
   first and second light sensitive transistor means having an optical input and an electrical output;
   means optically coupling the output of said first light emitting diode to the input of said first transistor means;
   means optically coupling the light output of said second transistor to the input of said second transistior means; and
   means for connecting said outputs of said first and second transistor means to the respective trigger inputs of said first and second semiconductor controlled rectifier means for providing a trigger voltage thereto.

6. Condition responsive alarm means comprising:
   condition responsive means for providing a representative DC voltage of a first polarity and of a voltage level functionally proportional to the level of the condition being monitored;
   reference voltage source means for providing a first predetermined DC reference voltage;
   first means for combining said first predetermined DC reference voltage and said representative DC voltage in voltage subtractive relationship to obtain a voltage essentially equal to the difference therebetween;
   a second voltage source for producing a second predetermined DC reference voltage;
   a third voltage source for providing an AC voltage;
   semiconductor controlled rectifier means, said controlled rectifier means having a control input and being connected in circuit with said third voltage source for rectifying AC voltage from said third source to produce a third DC reference voltage when said SCR is in the current conducting condition, said third DC reference voltage source being larger than said second DC reference voltage;

means coupling said first voltage combining means to the input of said SCR for biasing said SCR into the current conducting condition when the voltage from said combining means is above a predetermined level;

a voltage divider network;

means for combining said second and third DC reference voltages in voltage subtractive relationship across said voltage divider network;

tap means on said voltage divider network;

indicator means responsive to the voltage at said tap means for providing a first indication when said voltage is of a first polarity and a second signal indication when said voltage is of a second polarity.

7. The invention as defined in claim 6 further comprising: second tap means on said voltage divider network, second indicator means responsive to the voltage at said second tap means for providing a first signal indication when said polarity of the voltage at said second tap means is of a first polarity and for providing a second indication when said voltage is of a second polarity.

8. The invention as defined in claim 6 further comprising a small container, an electrical heater located in said container for producing heat, and wherein said semiconductor controlled rectifier means is located in said container exposed to said heat whereby the temperature of said controlled switch means is stabilized.

9. The invention as defined in claim 8 further comprising thermistor means, said thermistor having a positive temperature co-efficient of resistance and being connected in said first voltage combining means, and wherein said thermistor means is located in said container means, whereby said thermistor is maintained at the same ambient temperature level as said controlled rectifier means.

10. The invention as defined in claim 6 wherein said first indicator means includes: a source of AC; semiconductor controlled rectifier means, said controlled rectifier means having an input; first lamp means; electrically actuated audible signalling means, means connecting said lamp and audible signalling means in a parallel electrical circuit; means connecting said controlled rectifier means, said AC source and said parallel electrical circuit in series circuit; and means coupling said input of said controlled rectifier means in circuit with said tap means.

11. The invention as defined in claim 10 further comprising second lamp means, switch means, said switch means having a make contact, a break contact and a transfer contact, said transfer contact being connected in circuit with said AC source, said break contact being connected in circuit with said aubible signalling means and wherein said make contact is connected in circuit with said second lamp means.

12. Condition responsive alarm means comprising:
first means for generating a DC voltage of a first polarity and of a level dependent upon the condition being monitored;

reference voltage source means for providing a predetermined DC voltage of a second polarity, said voltage source means including a potentiometer having a movable tap, diode means, and resistor means;

an output juncture; means electrically connecting said diode means and said resistor means in series circuit between said tap and said output juncture;

thermistor means, said thermistor means being connected in series circuit with said first voltage generating means and said output terminal, whereby said reference voltage and said condition dependent voltage are connected in subtractive relationship to provide a voltage at said output terminal equal to the difference therebetween;

first and second AC voltage sources for providing first and second AC voltages, the level of said second AC voltage source being greater than the level of said first AC source and approximately 180° out of phase therewith;

rectifier means adapted to conduct current only during alternate half cycles of AC and first resistor means connected electrically in series with said rectifier means across said first AC source;

semiconductor controlled rectifier means having an input and adapted to conduct current only during alternate half cycles of AC when said input has a predetermined voltage applied thereto; second resistor means; said second resistor means connected in series with said controlled rectifier means across said second source;

each of said diode and semiconductor controlled rectifier means being poled in circuit to conduct current only during the same AC half cycles and means for combining the voltages as appear across said first and second resistors in a voltage subtractive relationship;

means coupling said output juncture to said controlled rectifier input; and means responsive to said combined voltage across said first and second resistors for providing a first indication when said voltage is of a first polarity and a second indication when said voltage is of the opposite polarity.

13. Condition responsive alarm means comprising:
condition respsonsive means for providing a DC voltage of a first polarity and a voltage level functionally proportional to the level of the condition being monitored;

reference voltage means for providing a first predetermined DC reference voltage;

first means for combining said first predetermined DC reference voltage and said representative DC voltage in voltage subtractive relationship to obtain a voltage essentially equal to the difference therebetween;

a second voltage source for producing a second predetermined DC reference voltage;

a third voltage source for providing a predetermined AC voltage;

semiconductor controlled rectifier means, said controlled rectifier means having a control input and being connected in circuit with said third voltage source for rectifying AC voltage therefrom to produce a third DC reference voltage;

means for combining said second and third DC reference voltages in voltage subtractive relationship;

means coupling said first voltage combining means to the input of said semiconductor controlled rectifier for biasing saiid controlled rectifier into the current conducting condition when the voltage thereof is above a predetermined level and into a noncurrent conducting condition when said voltage thereof is less than said predetermined voltage level; and alarm means responsive to the voltage of said second combining means for producing an alarm indication in response to said voltage being of a first polarity and for producing a second alarm indication when said voltage is of the opposite polarity.

* * * * *